United States Patent
Vashchenko et al.

(10) Patent No.: US 7,514,751 B2
(45) Date of Patent: Apr. 7, 2009

(54) SIGE DIAC ESD PROTECTION STRUCTURE

(75) Inventors: Vladislav Vashchenko, Palo Alto, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 21 days.

(21) Appl. No.: 11/890,097

(22) Filed: Aug. 2, 2007

(65) Prior Publication Data

US 2009/0032814 A1    Feb. 5, 2009

(51) Int. Cl.
*H01L 23/62* (2006.01)

(52) U.S. Cl. .................. 257/362; 257/734; 257/546; 257/E27.016

(58) Field of Classification Search ............... 257/362, 257/734, 536, 355, E27.016
See application file for complete search history.

(56) References Cited

U.S. PATENT DOCUMENTS

| 6,258,634 | B1 | 7/2001 | Wang et al. ................ 438/133 |
| 7,067,852 | B1 | 6/2006 | Vashchenko et al. ........ 257/173 |
| 7,202,136 | B2 | 4/2007 | Lanzerotti et al. ........... 438/312 |
| 2003/0047750 | A1* | 3/2003 | Russ et al. .................. 257/173 |
| 2004/0169231 | A1* | 9/2004 | Yu .............................. 257/355 |
| 2005/0151223 | A1* | 7/2005 | Voldman .................... 257/510 |
| 2006/0049462 | A1* | 3/2006 | Ju ............................... 257/355 |

\* cited by examiner

*Primary Examiner*—N Drew Richards
*Assistant Examiner*—Mamadou Diallo
(74) *Attorney, Agent, or Firm*—Mark C. Pickering

(57) ABSTRACT

A diode for alternating current (DIAC) electrostatic discharge (ESD) protection circuit is formed in a silicon germanium (SiGe) hetrojunction bipolar transistor (HBT) process that utilizes a very thin collector region. ESD protection for a pair of to-be-protected pads is provided by utilizing the base structures and the emitter structures of the SiGe transistors.

11 Claims, 7 Drawing Sheets

SIGE DIAC ESD PROTECTION STRUCTURE

BACKGROUND OF THE INVENTION

1. Field of the Invention

The present invention relates to a DIAC ESD protection structure and, more particularly, to a SiGe DIAC ESD protection structure.

2. Description of the Related Art

A diode for alternating current (DIAC) is a bidirectional diode that is commonly used in alternating current (AC) applications. In operation, when the voltage across a DIAC is less than a breakdown voltage, the DIAC is substantially non-conductive, providing a high-resistance current path between two nodes.

However, when the voltage across the DIAC exceeds the breakdown voltage, the DIAC becomes conductive, providing a low-resistance current path between the two nodes. The DIAC continues to provide a low-resistance current path until the current flowing through the DIAC falls below a holding current, at which time the DIAC switches back and again provides a high-resistance current path. Because of these operational characteristics, DIAC structures are also used to provide electrostatic discharge (ESD) protection for semiconductor devices.

Figure 1:
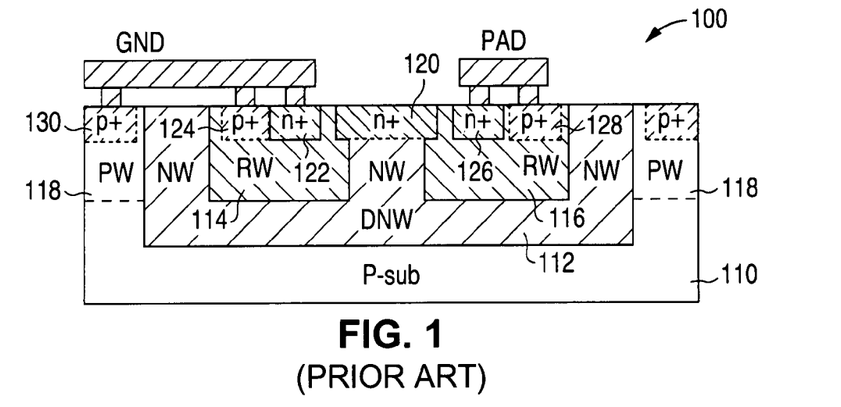
FIG. 1 is a cross-sectional view illustrating a prior-art CMOS DIAC ESD protection structure 100.

FIG. 1 shows a cross-sectional view that illustrates a prior-art CMOS DIAC ESD protection structure 100. As shown in FIG. 1, structure 100 includes a p-substrate 110, and a deep n-well 112 that is formed in p-substrate 110. Structure 100 also includes a pair of spaced-apart p-wells 114 and 116 that are formed in deep n-well 112, and a p-well 118 that is formed in substrate 110 to lie adjacent to deep n-well 112. Further, structure 100 includes an n+ region 120 that is formed in deep n– well 112 and the p-wells 114 and 116.

In addition, CMOS DIAC ESD protection structure 100 includes an n+ region 122 and a p+ region 124 that are formed in p-well 114, an n+ region 126 and a p+ region 128 that are formed in p-well 116, and a p+ region 130 that is formed in p-well 118. N+ region 122, p+ region 124, and p+ region 130 are connected to a ground pad, while n+ region 126 and p+ region 128 are connected to a to-be-protected pad.

During normal operation, when a positive voltage less than the breakdown voltage is placed on the to-be-protected pad, the positive voltage is also present on p+ region 128 and p-well 116. The positive voltage on p-well 116 forward biases the deep n-well 112/n+ region 120 junction, thereby causing holes to be injected into deep n-well 112/n+ region 120. The injected holes raise the potential of deep n-well 112/n+ region 120, thereby reverse biasing the junction between deep n-well 112/n+ region 120 and p-well 114. The reverse-biased junction blocks charge carriers from flowing from the to-be-protected pad to the ground pad.

In response to an ESD event, however, the reverse-biased junction between deep n-well 112/n+ region 120 and p-well 114 breaks down due to avalanche multiplication. The breakdown of the junction causes holes to be injected into p-well 114, and electrons to be injected into deep n-well 112. The holes injected into p-well 114 flow over and are collected by p+ region 124.

In addition, the flow of holes increases the potential of p-well 114 in the region that lies adjacent to n+ region 122, thereby forward biasing the junction between p-well 114 and n+ region 122. As a result, p-well 114 also injects holes into n+ region 122, while n+ region 122 injects electrons into p-well 114. Some of the electrons injected into p-well 114 drift over and are then injected into deep n-well 112/n+ region 120 across the broken down junction. The electrons injected into n-well 112/n+ region 120 are swept into p-well 116 across the forward-biased junction.

Figure 2:
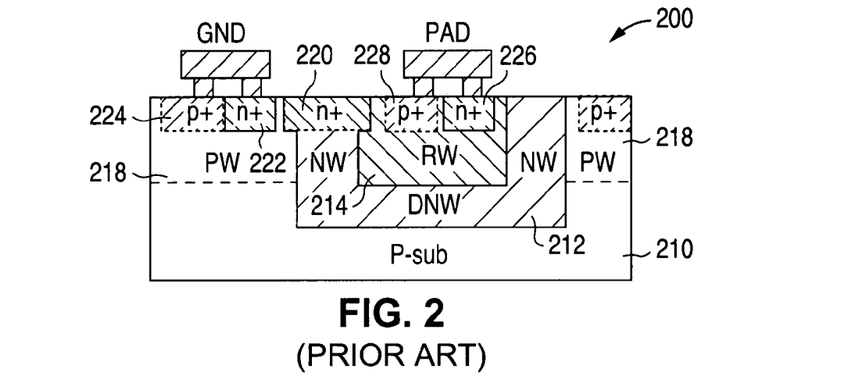
FIG. 2 is a cross-sectional view illustrating a prior-art CMOS DIAC ESD protection structure 200.

FIG. 2 shows a cross-sectional view that illustrates a prior-art CMOS DIAC ESD protection structure 200. As shown in FIG. 2, structure 200 includes a p– substrate 210, and a deep n-well 212 that is formed in p-substrate 210. Structure 200 also includes a p-well 214 that is formed in deep n-well 212, a p-well 218 that is formed in substrate 210 to lie adjacent to deep n-well 212, and an n+ region 220 that is formed in deep n– well 212, p-well 214, and p-well 218.

In addition, CMOS DIAC ESD protection structure 200 includes an n+ region 222 and a p+ region 224 that are formed in p-well 218, and an n+ region 226 and a p+ region 228 that are formed in p-well 214. N+ region 222 and p+ region 224 are connected to a ground pad, while n+ region 226 and p+ region 228 are connected to a to-be-protected pad.

During normal operation, when a positive voltage less than the breakdown voltage is placed on the to-be-protected pad, the positive voltage is also placed on p+ region 228 and p-well 214. The positive voltage on p-well 214 forward biases the deep n-well 212/n+ region 220 junction, thereby causing holes to be injected into deep n-well 212/n+ region 220. The injected holes raise the potential of deep n-well 212/n+ region 220, thereby reverse biasing the junction between deep n-well 212/n+ region 220 and p-substrate 210/p-well 218. The reverse-biased junction blocks charge carriers from flowing from the to-be-protected pad to the ground pad.

In response to an ESD event, however, the reverse-biased junction between deep n-well 212/n+ region 220 and p-substrate 210/p-well 218 breaks down due to avalanche multiplication. The breakdown of the junction causes holes to be injected into p– substrate 210/p-well 218, and electrons to be injected into deep n– well 212/n+ region 220. The holes injected into p-well 218 flow over and are collected by p+ region 224.

In addition, the flow of holes increases the potential of p-well 218 in the region that lies adjacent to n+ region 222, thereby forward biasing the junction between p-well 218 and n+ region 222. As a result, holes are also injected into n+ region 222 from p-well 218, while n+ region 222 injects electrons into p-well 218. Some of the electrons injected into p-well 218 drift over and are injected into deep n-well 212/n+ region 220 across the broken down junction. The electrons injected into n-well 212/n+ region 220 are swept into p-well 214 across the forward-biased junction.

Figure 3:
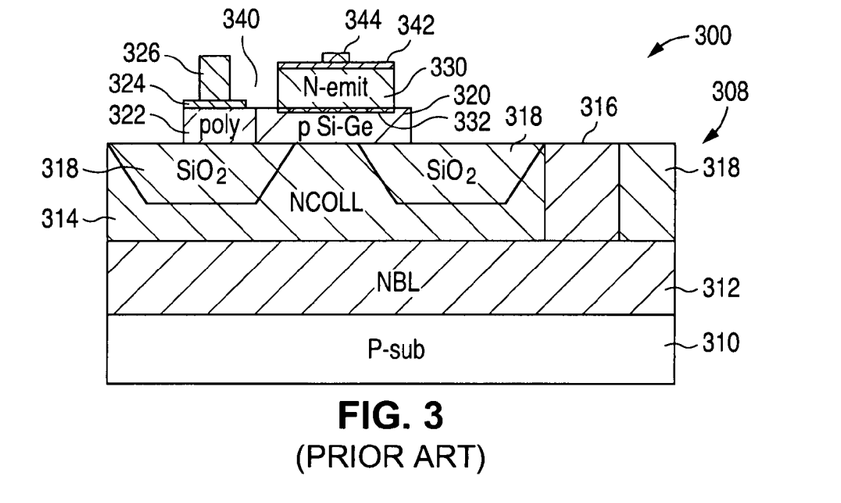
FIG. 3 is a cross-sectional view illustrating a prior-art silicon germanium (SiGe) hetrojunction bipolar transistor (HBT) 300.

FIG. 3 shows a cross-sectional view that illustrates a prior-art silicon germanium (SiGe) hetrojunction bipolar transistor (HBT) 300. As shown in FIG. 3, transistor 300 includes a semiconductor structure 308 that has a p-substrate 310, and an n+buried layer 312 that touches and lies over p-substrate 310. In addition, semiconductor structure 308 includes an n-type collector region 314 that touches the top surface of n+buried layer 312, an n+collector region 316 that extends down from the top surface of semiconductor structure 308 to touch n+buried layer 312, and a number of shallow trench isolation regions 318 that extend down from the top surface of semiconductor structure 308.

In addition, transistor 300 includes a p-type single-crystal-silicon germanium-carbon base region 320 that touches the top surface of n-type collector region 314, and a p+ polysilicon germanium-carbon base contact region 322 that touches the side of single-crystal-silicon germanium-carbon base region 320. Transistor 300 also has a silicide layer 324 that touches the top surface of region 322, and a metal base contact 326 that touches silicide layer 324.

As further shown in FIG. 3, transistor 300 includes an n+ polysilicon emitter region 330 that touches the top surface of single-crystal-silicon germanium-carbon base region 320, and an n+ emitter region 332 that lies in single-crystal-silicon germanium-carbon base region 320. (N+ emitter region 332 results from the out diffusion of dopants from n+ emitter region 330 during fabrication.) Transistor 300 additionally includes an isolation region 340 that isolates base region 322 from emitter region 330, a silicide layer 342 that touches the top surface of region 330, and a metal emitter contact 344 that touches silicide layer 342. Transistor 300 operates in a conventional manner.

One problem with transistor 300 is that semiconductor structure 308, which has a very thin collector region (314), is incompatible with the CMOS DIAC ESD protection structures 100 and 200, which utilize p-wells and deep n-wells. As a result, there is a need for a DIAC ESD protection structure that is compatible with SiGe HBTS.

DETAILED DESCRIPTION OF THE INVENTION

Figure 4:
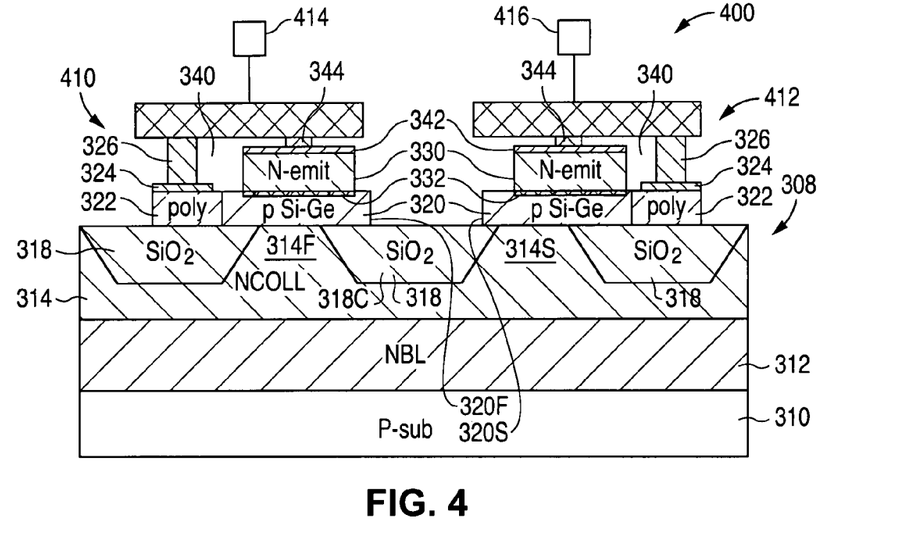
FIG. 4 is a cross-sectional view illustrating an example of a SiGe DIAC ESD protection structure 400 in accordance with the present invention.

FIG. 4 shows a cross-sectional view that illustrates an example of a SiGe DIAC ESD protection structure 400 in accordance with the present invention. Structure 400 is similar to transistor 300 and, as a result, utilizes the same reference numerals to designate the elements which are common to structure 400 and transistor 300.

As shown in FIG. 4, SiGe DIAC ESD protection structure 400 includes semiconductor structure 308 which has a p-substrate 310, and an n+buried layer 312 that touches and lies over p-substrate 310. In addition, semiconductor structure 308 includes an n-type collector region 314 that touches the top surface of n+buried layer 312, and a number of shallow trench isolation regions 318 that extend down from the top surface of semiconductor structure 308.

As further shown in FIG. 4, structure 400 also includes a pair of spaced-apart base/emitter structures 410 and 412 that are formed on the top surface of semiconductor structure 308 to touch n-type collector region 314 and a common shallow trench isolation region 318C. The base/emitter structures 410 and 412 both have a p-type single-crystal-silicon germanium-carbon base region 320 that touches the top surface of n-type collector region 314, and a p+ polysilicon germanium-carbon base contact region 322 that touches the side of single-crystal-silicon germanium-carbon base region 320.

In addition, a first area 314F of n-type collector region 314 lies below and touches the p-type single-crystal-silicon germanium-carbon base region 320 of base/emitter structure 410, and a second area 314S of n-type collector region 314 lies below and touches the p-type single-crystal-silicon germanium-carbon base region 320 of base/emitter structure 412. The first and second areas, 314F and 314S, in turn, are laterally spaced apart by only the common isolation region 318C. Also, a face 320F of p-type single-crystal-silicon germanium-carbon base region 320 of base/emitter structure 410, and a face 320S of p-type single-crystal-silicon germanium-carbon base region 320 of base/emitter structure 412 touch isolation region 318C, directly oppose each other, and are substantially parallel.

As further shown in FIG. 4, the base/emitter structures 410 and 412 also both have a silicide layer 324 that touches the top surface of region 322, and a metal base contact 326 that touches silicide layer 324. In addition, the base/emitter structures 410 and 412 both have an n+ polysilicon emitter region 330 that touches the top surface of single-crystal-silicon germanium-carbon base region 320, and an n+emitter region 332 that lies in single-crystal-silicon germanium-carbon base region 320. The base/emitter structures 410 and 412 both additionally have an isolation region 340 that isolates region 322 from emitter region 330, a silicide layer 342 that touches the top surface of region 330, and a metal emitter contact 344 that touches silicide layer 342.

Further, the metal base contact 326 and the metal emitter contact 344 of base/emitter structure 410 are connected together, and to a pad 414. Similarly, the metal base contact 326 and the metal emitter contact 344 of base/emitter structure 412 are connected together, and to a pad 416.

During normal operation, when pad 414 is connected to ground and pad 416 is connected to a positive voltage less than the breakdown voltage, the positive voltage is also placed on polysilicon germanium base contact region 322 of base/emitter structure 412, and thereby on single-crystal-silicon germanium-carbon base region 320 of base/emitter structure 412.

The positive voltage on single-crystal-silicon germanium-carbon base region 320 forward biases the junction between p-type single-crystal-silicon germanium-carbon base region 320 of base/emitter structure 412 and the n-type collector region 314, thereby causing holes to be injected into n-type collector region 314. The injected holes raise the potential on n-type collector region 314, thereby reverse biasing the junction between n-type collector region 314 and p-type single-crystal-silicon germanium-carbon base region 320 of base/emitter structure 410. The reverse-biased junction blocks charge carriers from flowing from pad 416 to pad 414.

In response to an ESD event, however, the reverse-biased junction between n-type collector region 314 and p-type single-crystal-silicon germanium-carbon base region 320 of base/emitter structure 410 breaks down due to avalanche multiplication. The breakdown of the junction causes holes to be injected into p-type single-crystal-silicon germanium-carbon base region 320 of base/emitter structure 410, and electrons to be injected into n-type collector region 314. The holes injected into p-type single-crystal-silicon germanium-carbon base region 320 of base/emitter structure 410 then flow over to polysilicon germanium-carbon base region 322 to be collected by metal base contact 326 of base/emitter structure 410.

In addition, the flow of holes increases the potential of p-type single-crystal-silicon germanium-carbon base region 320 of base/emitter structure 410 in the region that lies adjacent to n+ region 332, thereby forward biasing the junction between p-type single-crystal-silicon germanium-carbon base region 320 and n+emitter region 332 of base/emitter structure 410.

As a result, p-type single-crystal-silicon germanium-carbon base region 320 also injects holes into n+ emitter region 332, and n+ emitter region 332 injects electrons into p-type single-crystal-silicon germanium-carbon base region 320 of base/emitter structure 410. Some of the electrons injected to base region 320 drift over and are then swept into n– type collector region 314 across the broken down junction. The electrons swept into n-type collector region 314 are injected into p-type base region 320 of base/emitter structure 412 across the forward-biased junction.

In addition, due to the symmetry between the base/emitter structures 410 and 412, the polarities of the pads 414 and 416 can be reversed in response to an ESD event. In this case, the above described operation remains the same, but reversed between the base/emitter structures 410 and 412.

Figure 5:
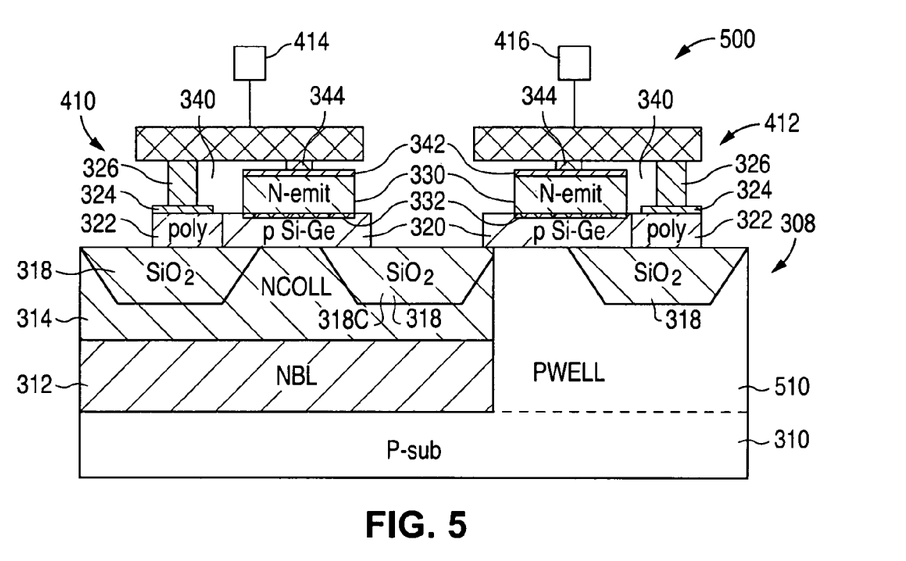
FIG. 5 is a cross-sectional view illustrating an example of a SiGe DIAC ESD protection structure 500 in accordance with the present invention.

FIG. 5 shows a cross-sectional view illustrating an example of a SiGe DIAC ESD protection structure 500 in accordance with the present invention. Structure 500 is similar to structure 400 and, as a result, utilizes the same reference numerals to designate the elements that are common to both structures.

As shown in FIG. 5, structure 500 differs from structure 400 in that structure 500 includes a p-well 510 that is formed in semiconductor structure 308 to extend down from the top surface of structure 308 to touch p-substrate 310. As further shown in FIG. 5, single-crystal-silicon germanium-carbon base 320 of base/emitter structure 412 contacts p-well 510.

During normal operation, when pad 414 is connected to ground and pad 416 is connected to a positive voltage less than the breakdown voltage, the positive voltage is also placed on polysilicon germanium-carbon base contact region 322 of base/emitter structure 412, and thereby on single-crystal-silicon germanium-carbon base region 320 of base/emitter structure 412, p-well 510, and p-substrate 310.

The positive voltage on p-well 510 and p– substrate 310 forward biases the junction between p-well 510/substrate 310 and n-type collector region 314/buried layer 312, thereby causing holes to be injected into n-type collector region 314/buried layer 312. The injected holes raise the potential on n-type collector region 314, thereby reverse biasing the junction between n-type collector region 314 and p-type single-crystal-silicon germanium-carbon base region 320 of base/emitter structure 410. The reverse-biased junction blocks charge carriers from flowing from pad 416 to pad 414.

In response to an ESD event, however, the reverse-biased junction between n-type collector region 314 and p-type single-crystal-silicon germanium-carbon base region 320 of base/emitter structure 410 breaks down due to avalanche multiplication. The breakdown of the junction causes holes to be injected into p-type single-crystal-silicon germanium-carbon base region 320 of base/emitter structure 410, and electrons to be injected into n-type collector region 314. The holes injected into p-type single-crystal-silicon germanium-carbon base region 320 of base/emitter structure 410 then flow over to polysilicon germanium-carbon base region 322 to be collected by metal base contact 326 of base/emitter structure 410.

In addition, the flow of holes increases the potential of p-type single-crystal-silicon germanium-carbon base region 320 of base/emitter structure 410 in the region that lies adjacent to n+ region 332, thereby forward biasing the junction between p-type single-crystal-silicon germanium-carbon base region 320 and n+ emitter region 332 of base/emitter structure 410.

As a result, p-type single-crystal-silicon germanium-carbon base region 320 injects holes into n+ emitter region 332, and n+ emitter region 332 injects electrons into p-type single-crystal-silicon germanium-carbon base region 320 of base/emitter structure 410. Some of the electrons injected into base region 320 drift over and are then swept into n-type collector region 314 across the broken down junction. The electrons swept into n-type collector region 314 are injected into p-type single-crystal-silicon germanium-carbon base region 320 of base/emitter structure 412 across the forward-biased junction.

Figure 6:
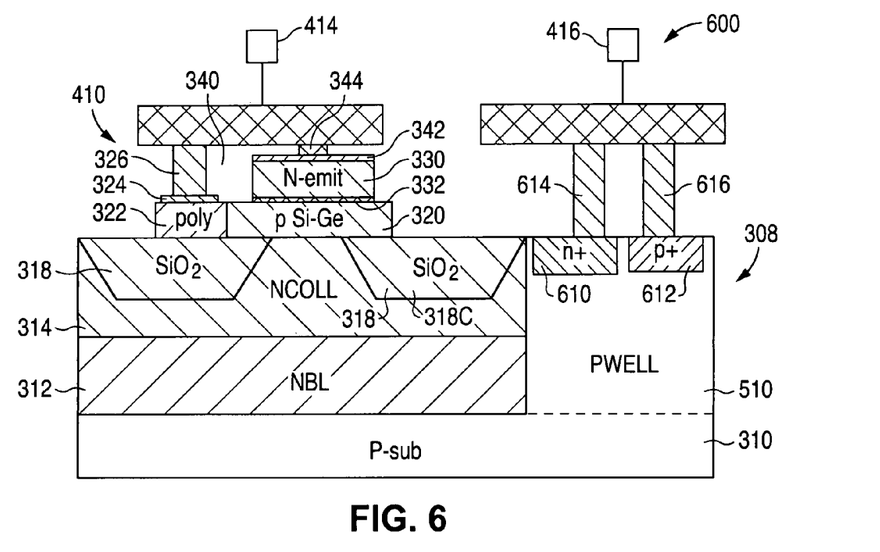
FIG. 6 is a cross-sectional view illustrating an example of a SiGe DIAC ESD protection structure 600 in accordance with the present invention.

FIG. 6 shows a cross-sectional view illustrating an example of a SiGe DIAC ESD protection structure 600 in accordance with the present invention. Structure 600 is similar to structure 500 and, as a result, utilizes the same reference numerals to designate the elements that are common to both structures.

As shown in FIG. 6, structure 600 differs from structure 500 in that structure 600 includes an n+ region 610 and a p+ region 612 that are formed in p-well 510, and metal contact structures 614 and 616 that touch n+ region 610 and p+ region 612, respectively, in lieu of base/emitter structure 412. Further, metal contact structures 614 and 616 are connected together, and to pad 416.

During normal operation, when pad 414 is connected to ground and pad 416 is connected to a positive voltage less than the breakdown voltage, the positive voltage is also placed on p+ region 612, and thereby on p-well 510 and p-substrate 310. The positive voltage on p-well 510 and p-substrate 310 forward biases the junction between p-well 510/substrate 310 and n-type collector region 314/buried layer 312, thereby causing holes to be injected into n-type collector region 314/buried layer 312. The injected holes raise the potential on n-type collector region 314 of base/emitter structure 410, thereby reverse biasing the junction between n-type collector region 314 and p-type single-crystal-silicon germanium-carbon base region 320 of base/emitter structure 410. The reverse-biased junction blocks charge carriers from flowing from pad 416 to pad 414.

In response to an ESD event, however, the reverse-biased junction between n-type collector region 314 and p-type single-crystal-silicon germanium-carbon base region 320 of base/emitter structure 410 breaks down due to avalanche multiplication. The breakdown of the junction causes holes to be injected into p-type single-crystal-silicon germanium-carbon base region 320 of base/emitter structure 410, and electrons to be injected into n-type collector region 314. The holes injected into p-type single-crystal-silicon germanium-carbon base region 320 of base/emitter structure 410 then flow over to polysilicon germanium-carbon base region 322 to be collected by metal base contact 326 of base/emitter structure 410.

In addition, the flow of holes increases the potential of p-type single-crystal-silicon germanium-carbon base region 320 of base/emitter structure 410 in the region that lies adjacent to n+ region 332, thereby forward biasing the junction between p-type single-crystal-silicon germanium-carbon base region 320 and n+ emitter region 332 of base/emitter structure 410.

As a result, p-type single-crystal-silicon germanium-carbon base region 320 also injects holes into n+ emitter region 332, and n+ emitter region 332 injects electrons into p-type single-crystal-silicon germanium-carbon base region 320 of base/emitter structure 410. Some of the electrons injected into base region 320 drift over and are then swept into n-type collector region 314 across the broken down junction. The electrons swept into n-type collector region 314 are injected into p-well 510 across the forward-biased junction.

The SiGe DIAC ESD protection structures 400, 500, and 600 can be formed with only minor modifications to any conventional SiGe HBT process flow. FIGS. 7-21 show a series of cross-sectional views that illustrate an example of a method of forming the SiGe DIAC ESD protection structures 400, 500, and 600 in accordance with the present invention.

Figure 7:
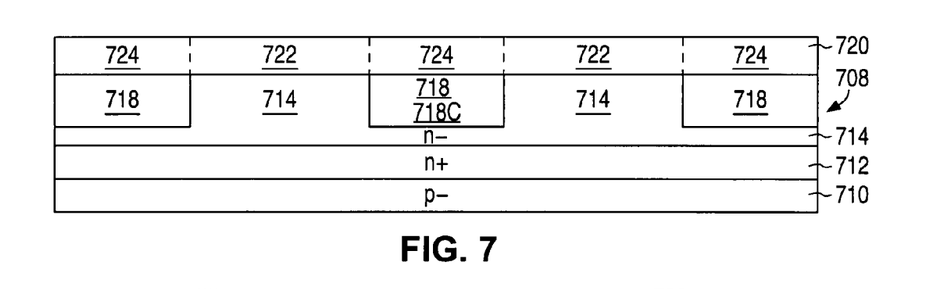
FIGS. 7-21 are a series of cross-sectional views illustrating an example of a method of forming the SiGe DIAC ESD protection structures 400, 500, and 600 in accordance with the present invention.

As shown in FIG. 7, the method utilizes a conventionally-formed semiconductor structure 708 that includes a p− substrate 710, and an n+ buried layer 712 that touches and lies over p-substrate 710. In addition, semiconductor structure 708 includes an n-type collector region 714 that extends down from the top surface of semiconductor structure 708 to touch the top surface of n+ buried layer 712, and a number of shallow trench isolation regions 718 that extend down from the top surface of semiconductor structure 708.

As further shown in FIG. 7, the method begins by epitaxially growing a p-type silicon germanium carbon layer 720 on semiconductor structure 708. The regions above n-type collector region 714 grow as a single crystal silicon germanium carbon layer 722, while the regions above the shallow trench isolation regions 718 grow as a polysilicon germanium carbon layer 724. While silicon germanium carbon is illustrated in this example, other semiconductor materials can alternately be used.

Figure 8:
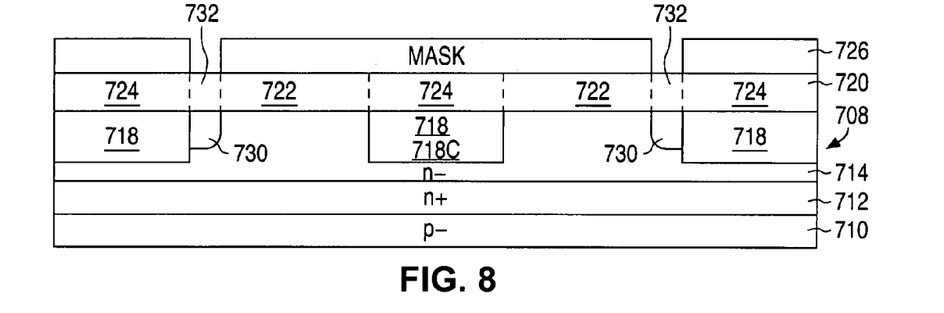
Figure 9:
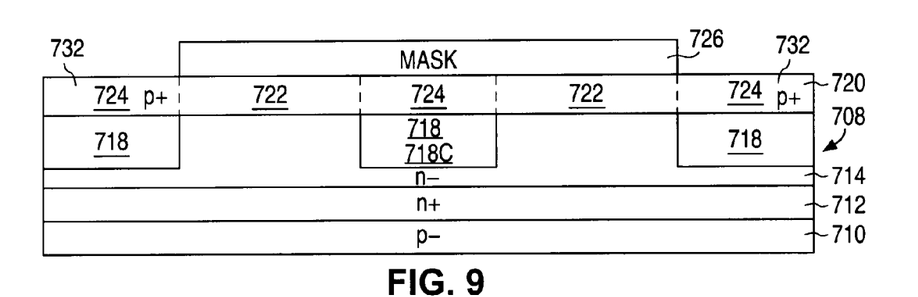

As shown in FIG. 8, after silicon germanium carbon layer 720 has been grown, a mask 726 is formed and patterned on silicon germanium carbon layer 720. Following this, a p-type dopant, such as boron, is implanted to form p+ regions 730 in n-type collector region 714, and p+ regions 732 in silicon germanium carbon layer 720. Alternately, as shown in FIG. 9, mask 726 can be patterned such that no p+ region 730 is formed, and the p+ regions 732 are formed in polysilicon germanium carbon layer 724. Following the implant, mask 726 is removed.

Figure 10:
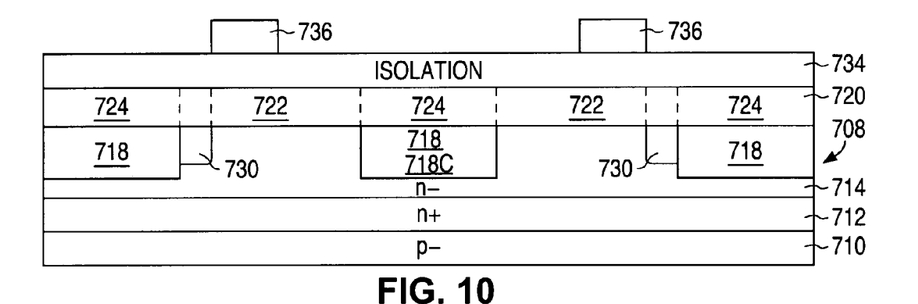

Once mask 726 has been removed, as shown in FIG. 10, a layer of isolation material 734, such as a layer of oxide and an overlying layer of nitride, is formed on silicon germanium carbon layer 720. Next, a mask 736 is formed and patterned on isolation layer 734. Following this, the exposed regions of isolation layer 734 are etched away. Mask 736 is then removed.

Figure 11:
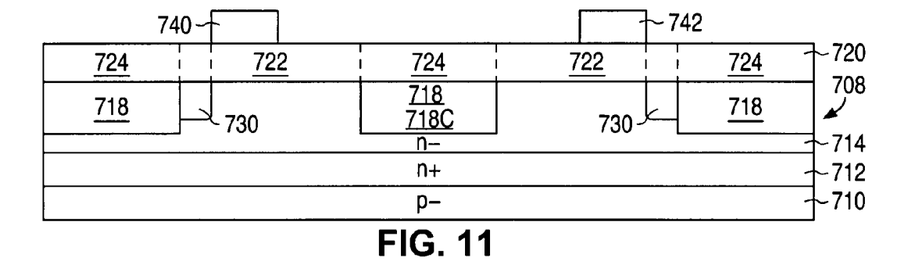
Figure 12:
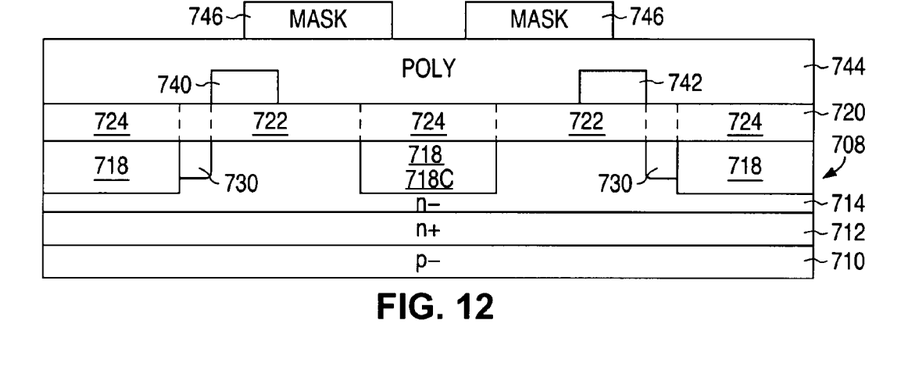
Figure 13:
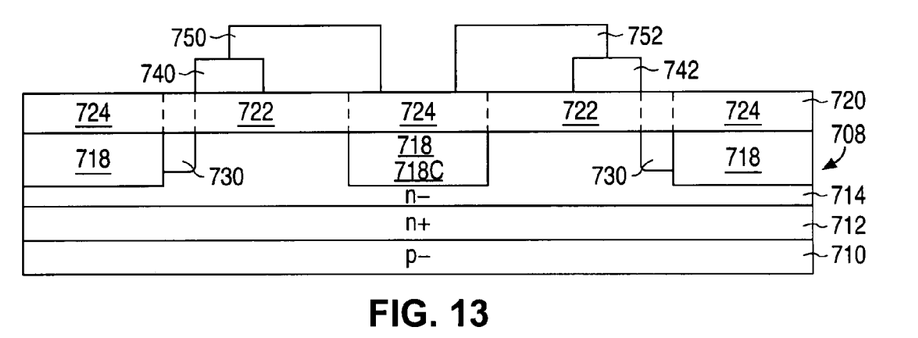

As shown in FIG. 11, the etch forms an isolation region 740 and an isolation region 742. Next, as shown in FIG. 12, a layer of n+ polysilicon 744 is formed on silicon germanium carbon layer 720 and the isolation regions 740 and 742. After polysilicon layer 744 has been formed, a mask 746 is formed and patterned on polysilicon layer 744. Following this, as shown in FIG. 13, the exposed regions of polysilicon layer 744 are etched away to form an emitter region 750 that touches isolation region 740 and silicon germanium carbon layer 720, and an emitter region 752 that touches isolation region 742 and silicon germanium carbon layer 720. In addition, both emitter regions 750 and 752 lie over a common isolation region 718C. Following the etch, mask 746 is removed.

Figure 14:
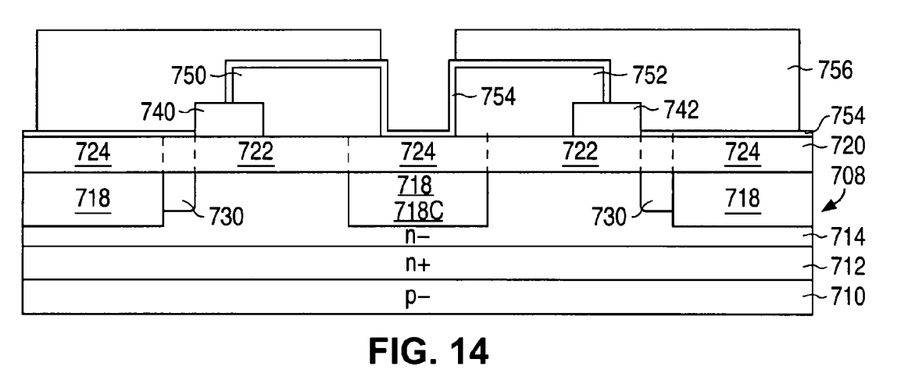

As shown in FIG. 14, after the formation of the emitter regions 750 and 752, a layer of silicide 754 is formed on the exposed regions of silicon germanium carbon layer 720 and the emitter regions 750 and 752. Following this, a mask 756 is formed and patterned on the isolation regions 740 and 742, and silicide layer 754.

Figure 15:
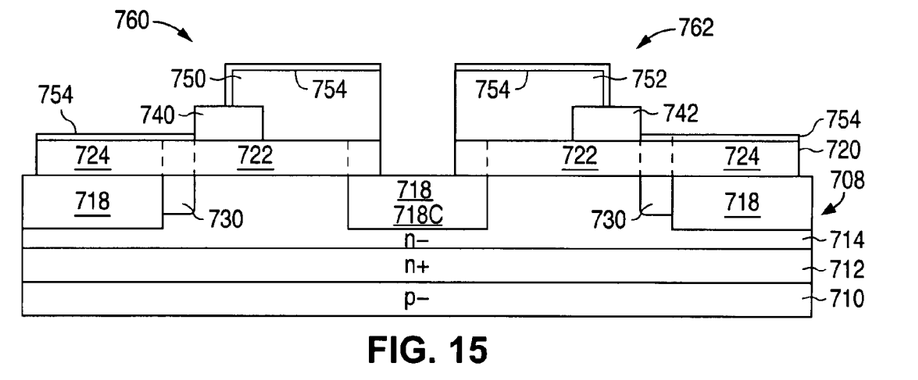

Next, as shown in FIG. 15, the exposed regions of silicide layer 754 and the underlying regions of silicon germanium carbon layer 720 are etched away. The etch forms a base/emitter structure 760 and a base/emitter structure 762 that both touch common isolation region 718C. Mask 756 is then removed.

Figure 16:
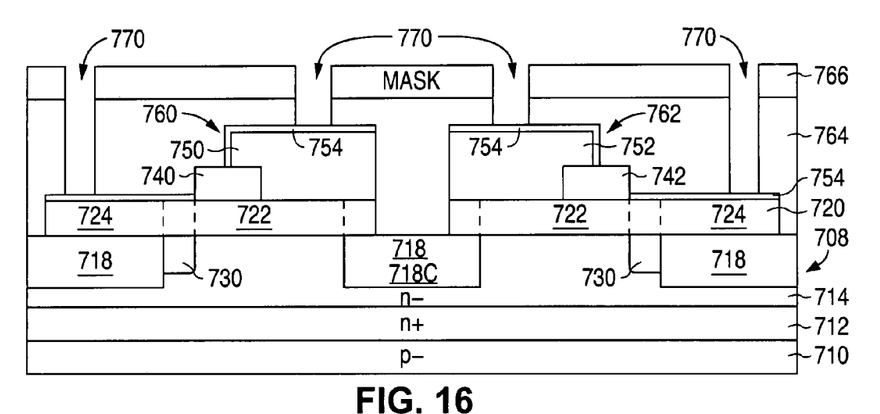

Once mask 756 has been removed, as shown in FIG. 16, a layer is insulation material 764 is formed on the exposed regions of the isolation regions 718, silicon germanium carbon layer 720, and the base/emitter structures 760 and 762. Next, a mask 766 is formed and patterned on insulation layer 764. Following this, the exposed regions of insulation layer 764 are etched to form openings 770 that expose the silicide layers 754. Mask 766 is then removed.

Figure 17:
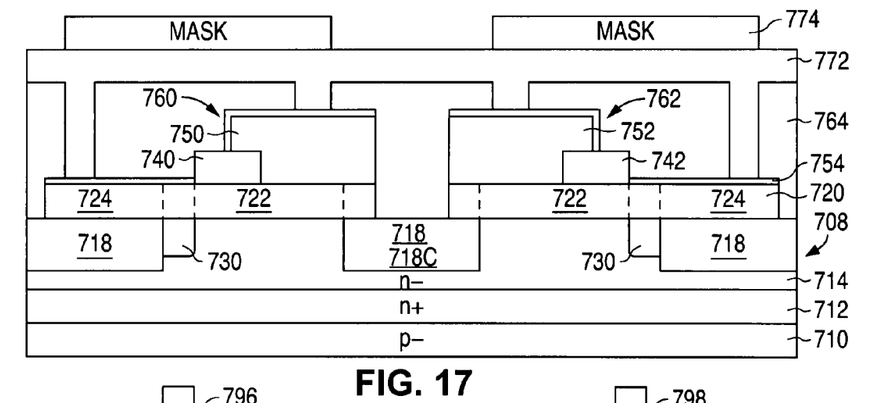

Next, as shown in FIG. 17, a layer of conductive material 772 is deposited on insulation layer 764 to fill up the openings 770. Following this, a mask 774 is formed and patterned on conductive layer 772. After mask 774 has been formed, the exposed regions of conductive layer 772 are etched until removed. Mask 774 is then removed.

Figure 18:
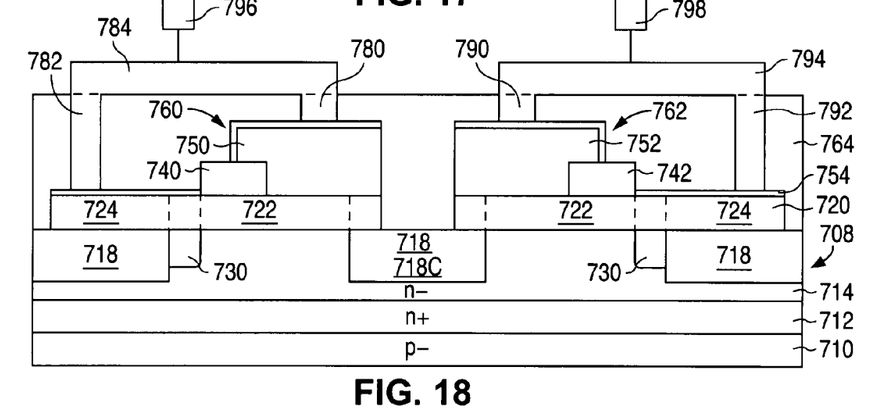

As shown in FIG. 18, the etch forms a first contact 780, a second contact 782, a first metal trace 784 that touches the first and second contacts 780 and 782. The etch also forms a third contact 790, a fourth contact 792, and a second metal trace 794 that touches the third and fourth contacts 790 and 792. First metal trace 784 electrically connects the polysilicon germanium carbon layer 720 of base/emitter structure 760 to the emitter region 750 of base/emitter structure 760. Second metal trace 794 electrically connects the polysilicon germanium carbon layer 720 of base/emitter structure 762 to the emitter region 752 of base/emitter structure 762.

The method then continues with conventional steps to form metal interconnect structures that include pads 796 and 798 that are connected to metal traces 784 and 794, respectively. The described method is similar to the process for forming a SiGe HBT as taught in U.S. Pat. No. 7,202,136 issued on Apr. 10, 2007, which is hereby incorporated by reference.

Figure 19:
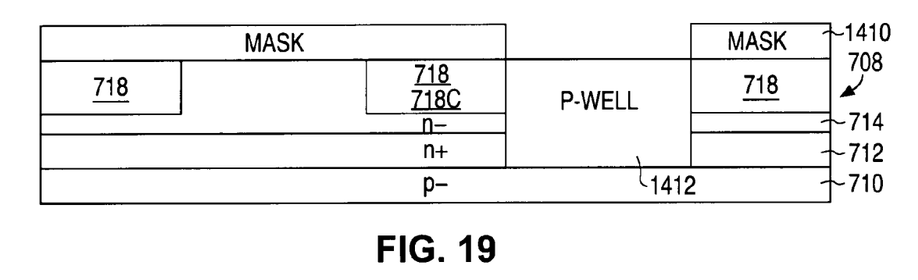

SiGe DIAC ESD protection structure 500 can be formed in the same manner that structure 400 was formed, except that before silicon germanium carbon layer 720 is grown, a mask 1410 is formed on semiconductor structure 708 as shown in FIG. 19. Following this, the exposed regions of semiconductor structure 708 are implanted with a p-type material, such as boron, to form a p-well 1412 that extends down and touches p-substrate 710. Mask 1410 is then removed, and the method continues as described above with the growth of silicon germanium carbon layer 720.

Figure 20:
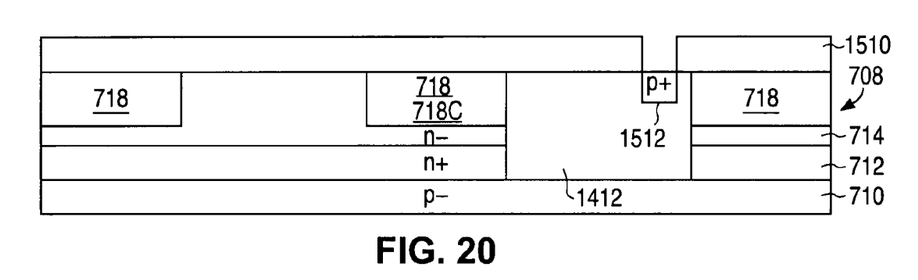

SiGe DIAC ESD protection structure 600 can be formed in the same manner that structure 500 was formed, except that after p-well 1412 has been formed and mask 1410 has been removed, a mask 1510 is formed and patterned on the top surface of semiconductor structure 708 as shown in FIG. 20. Following this, the exposed regions of semiconductor structure 708 are implanted with a p-type material, such as boron, to form a p+ region 1512 in the top surface of p-well 1412. Mask 1510 is then removed.

Figure 21:
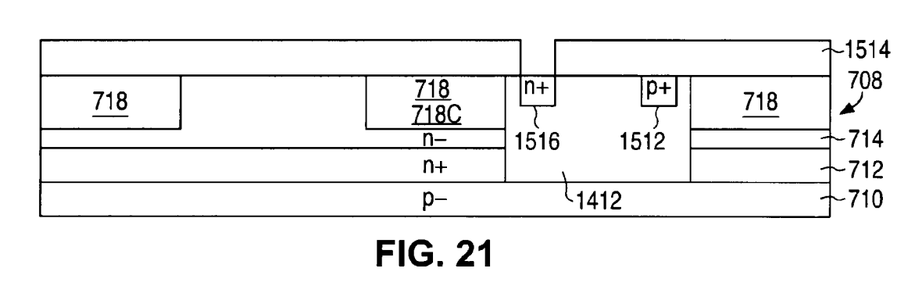

As shown in FIG. 21, after mask 1510 has been removed, a mask 1514 is formed and patterned on the top surface of semiconductor structure 708. Following this, the exposed regions of semiconductor structure 708 are implanted with an n-type material, such as phosphorous, to form an n+ region 1516 in the top surface of p-well 1412. Mask 1514 is then removed and the process continues as above, except that a base/emitter structure is not formed over p-well 1412.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. An electrostatic discharge (ESD) protection circuit comprising:
    a semiconductor structure having:
        a substrate of a first conductivity type;
        a buried layer of a second conductivity type that touches the substrate;
        a surface region of the second conductivity type that touches the buried layer and a top surface of the semiconductor structure, the surface region having a dopant concentration that is lower than a dopant concentration of the buried layer; and
        an isolation region that extends down from the top surface of the semiconductor structure;
    spaced-apart first and second regions of the first conductivity type that lie on the top surface of the semiconductor structure and touch the isolation region;
    spaced-apart third and fourth regions of the second conductivity type that lie on and touch the first and second regions, respectively;
    spaced-apart first and second contacts electrically connected to the first and third regions, respectively, and to a first pad; and
    spaced-apart third and fourth contacts electrically connected to the second and fourth regions, respectively, and to a second pad.

2. The ESD protection circuit of claim 1 wherein a first area that lies below and touches the first region and a second area that lies below and touches the second region are laterally spaced apart by only the isolation region.

3. The ESD protection circuit of claim 1 wherein a face of the first region and a face of the second region touch the isolation region, directly oppose each other, and are substantially parallel.

4. The ESD protection circuit of claim 3 wherein the first region includes a region of single crystal silicon germanium and a region of polysilicon germanium, and the second region includes a region of single crystal silicon germanium and a region of polysilicon germanium.

5. The ESD protection circuit of claim 1 wherein the semiconductor structure further includes a well of the first conductivity type that extends down from the top surface of the semiconductor structure to touch the substrate.

6. The ESD protection circuit of claim 5 wherein the first region touches the surface region and the second region touches the well.

7. The ESD protection circuit of claim 6 wherein the first and second regions are silicon germanium regions.

8. The ESD protection circuit of claim 7 wherein the first region includes a region of single crystal silicon and a region of polysilicon, and the second region includes a region of single crystal silicon and a region of polysilicon.

9. An electrostatic discharge (ESD) protection circuit comprising:
    a semiconductor structure having:
        a substrate of a first conductivity type;
        a buried layer of a second conductivity type that touches the substrate;
        a surface region of the second conductivity type that touches the buried layer and a top surface of the semiconductor structure, the surface region having a dopant concentration that is lower than a dopant concentration of the buried layer;
        a well of the first conductivity type that extends down from the top surface of the semiconductor structure to touch the substrate, the well being electrically connected to a first pad; and
        an isolation region that extends down from the top surface of the semiconductor structure;
    a first region of the first conductivity type that lies on the top surface of the semiconductor structure and touches the surface region and the isolation region, the first region being spaced apart from the well;
    a second region of the second conductivity type that lies on and touches the first region; and
    spaced-apart first and second contacts electrically connected to the first and second regions, respectively, and to a second pad.

10. The ESD protection circuit of claim 9 wherein the well touches the isolation region.

11. The ESD protection circuit of claim 10 wherein the semiconductor structure further includes a third region of the second conductivity type, the third region being spaced apart from the surface region, and electrically connected to the first pad.

* * * * *